US007898081B2

(12) United States Patent
(10) Patent No.: US 7,898,081 B2

Lan et al.

(45) Date of Patent: Mar. 1, 2011

(54) MEMS DEVICE AND METHOD OF MAKING THE SAME

(75) Inventors: Bang-Chiang Lan, Taipei (TW); Li-Hsun Ho, Hsinchu County (TW); Wei-Cheng Wu, Hsinchu County (TW); Hui-Min Wu, Changhua County (TW); Min Chen, Taipei County (TW); Chien-Hsin Huang, Taichung (TW); Ming-I Wang, Taipei County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 316 days.

(21) Appl. No.: 12/168,057

(22) Filed: Jul. 3, 2008

(65) Prior Publication Data

US 2010/0002894 A1 Jan. 7, 2010

(51) Int. Cl.
*H01L 23/00* (2006.01)
*H02K 41/00* (2006.01)

(52) U.S. Cl. ............... 257/734; 257/E23.141; 310/12.02

(58) Field of Classification Search .................. 257/415, 257/773, 734, E21.499, E23.141; 381/163; 29/594; 181/148; 310/12.03, 12.13

See application file for complete search history.

(56) References Cited

U.S. PATENT DOCUMENTS 6,936,524 B2 8/2005 Zhu et al.
2002/0130561 A1 * 9/2002 Temesvary et al. ............. 310/12

OTHER PUBLICATIONS

U.S. Appl. No. 12/056,286, Integrated structure for MEMS device and semiconductor device and method of fabricating the same, All, Mar. 27, 2008.

* cited by examiner

*Primary Examiner* — Thomas L Dickey
*Assistant Examiner* — Nikolay Yushin
(74) *Attorney, Agent, or Firm* — Winston Hsu; Scott Margo

(57) ABSTRACT

A MEMS device includes a vent hole structure and a MEMS structure disposed on a same side of a substrate. The vent hole structure adjoins the MEMS structure with an etch stop structure therebetween. The MEMS structure includes a chamber, the vent hole structure includes a metal layer having at least a hole thereon as a vent hole to connect the chamber of the MEMS structure through the etch stop structure. Accordingly, the MEMS device has a lateral vent hole. Furthermore, as the vent hole structure and the MEMS structure are disposed on the same side of the substrate, the manufacturing process is convenient and timesaving.

24 Claims, 8 Drawing Sheets

MEMS DEVICE AND METHOD OF MAKING THE SAME

BACKGROUND OF THE INVENTION

1. Field of the Invention

The present invention relates to a micro-electro-mechanical systems (MEMS) device and a method of making the same, and, more particularly, to a MEMS device with a lateral vent hole and a method of making the same.

2. Description of the Prior Art

MEMS devices include micromachines integrated with electronic microcircuits on substrates. Such devices may form, for example, microsensors or microactuators which operate based on, for example, electromagnetic, electrostrictive, thermoelectric, piezoelectric, or piezoresistive effects. MEMS devices have been formed on insulators or other substrates using micro-electronic techniques such as photolithography, vapor deposition, and etching. Recently, MEMS is fabricated using the same types of steps (such as the deposition of layers of material and the selective removal of the layers of material) that are used to fabricate conventional analog and digital complementary metal oxide semiconductor (CMOS) circuits.

The recent ability to seal micro-machined meshes has lead to the fabrication of microphones and microspeakers. A sealed mesh can function as a movable plate of a variable capacitor, and therefore can operate as a microspeaker or microphone. For a sealed mesh to operate as a microspeaker or microphone, the device needs to be able to push air to create a soundwave just as its larger counterparts must push air to create soundwaves. In the case of a microspeaker or microphone, if the chamber beneath the sealed mesh does not have a vent or other opening to ambient, movement of the sealed mesh inward is inhibited by the inability to compress the air in the chamber while movement of the mesh outward is inhibited by formation of a vacuum. Thus it is necessary to form a vent in the chamber.

Currently, such vents are formed by boring through the silicon substrate from the rear. For example, a method of making a MEMS device is disclosed in U.S. Pat. No. 6,936,524 that comprises some steps as shown in FIGS. 1 and 2. FIG. 1 shows the formation of vent holes after the mesh has been released and the pilot openings expanded. As shown in FIG. 1, a first dielectric layer 14, a first metal layer 16, a second dielectric layer 20, a second metal layer 22, a third dielectric layer 26, a third metal layer 28, a top dielectric layer 32, and a photo-resist layer 38 are stacked on the right surface of the silicon substrate 12. The first metal layer 16 is patterned to allow a portion thereof to form a structure of micro-machined mesh metal 18. The second and the third metal layers 22 and 28 each have an opening above the micro-machined mesh metal 18 to expose the micro-machined mesh metal 18. The photo-resist layer 38 covers the above of the third metal layer 28 to protect the portion not to be etched. The reverse surface of the silicon substrate 12 is adhered to a first carrier wafer 36 through an adhesive 34. Thus, a deep reactive-ion etching (DRIE) process, and subsequently reactive-ion etching (RIE) process, inductively coupled plasma reactive ion etching process, or XeF2 etching process 24 are performed on the right surface of the silicon substrate 12 to partially etch the silicon substrate 12 and to release the micro-machined mesh metal 18 to form vent holes 40. FIG. 2 shows another example. After the right surface of the silicon substrate 12 is protected by a protection layer 45 and adhered to a second carrier wafer 44 through an adhesive 42, an RIE or a DRIE process 48 is performed on the silicon substrate 12 using a photo-resist mask 46 from the reverse surface of the silicon substrate 12. However, the silicon substrate typically has a thickness of about 700 microns, and it may still remain more than 300 microns even after certain polishing steps are carried out during the manufacturing process. It would be a tedious process to etch though the substrate no matter from the rear or the front.

Therefore, there is still a need for a novel MEMS device structure and the making method to conveniently making such devices.

SUMMARY OF THE INVENTION

An objective of the present invention is to provide a novel MEMS device and a method of making the same for conveniently making such devices.

In an aspect of the present invention, the MEMS device comprises a substrate, a MEMS structure disposed on the substrate, and a vent hole structure disposed on a same side of the substrate on which the MEMS structure is disposed. The vent hole structure adjoins the MEMS structure with a first etch stop structure therebetween. The MEMS structure comprises at least an electrode disposed within or on the substrate, and a micro-machined metal mesh disposed over the substrate. Accordingly, a first chamber is formed between the micro-machined metal mesh and the substrate. The vent hole structure comprises a metal layer disposed over the substrate, a second chamber formed between the metal layer and the substrate and communicating with the first chamber through beneath the first etch stop structure, and a plurality of vent holes throughout the metal layer to communicate with the second chamber.

In another aspect of the present invention, the MEMS device comprises a substrate; a MEMS structure disposed on the substrate; and a vent hole structure disposed on a same side of the substrate on which the MEMS structure is disposed. The vent hole structure adjoins the MEMS structure with a first etch stop structure therebetween. The MEMS structure comprises at least an electrode disposed within or on the substrate, and a micro-machined metal mesh disposed over the substrate such that a chamber is formed between the micro-machined metal mesh and the substrate. The vent hole structure comprises at least a vent hole surrounded by the first etch stop structure or a second etch stop structure, wherein the at least a vent hole communicates with the chamber through beneath the first and the second etch stop structures.

In further another aspect of the present invention, the method of making a MEMS device comprises steps as follow. A substrate comprising a MEMS region having an electrode disposed within or on the substrate and a vent hole region adjoining the MEMS region is provided. A plurality of interlayer dielectrics are formed on the substrate. A micro-machined metal mesh is formed in one, other than the bottom layer and the top layer, of the interlayer dielectrics, over the electrode in the MEMS region. A metal hard mask is formed in one of the interlayer dielectrics, over and corresponding to the micro-machined metal mesh. A first etch stop structure is formed by alternately stacking a plurality of metal layers and a plurality of trench-shaped vias in a lower one of the interlayer dielectrics between the vent hole region and the MEMS region upwardly to the top one of the interlayer dielectrics and allowing the bottom of the first etch stop structure to be higher than the bottom layer of the interlayer dielectrics and not higher than the micro-machined metal mesh. A second etch stop structure is formed by alternately stacking a plurality of metal layers and a plurality of trench-shaped vias in a lower one of the interlayer dielectrics in the vent hole region upwardly to an upper one of the interlayer dielectrics and allowing the bottom of the second etch stop structure to be higher than the bottom layer of the interlayer dielectrics, the second etch stop structure is in a grid shape. A release process is performed to remove the interlayer dielectrics in the MEMS region and the vent hole region, thereby to form a hollowed-out micro-machined metal mesh, to form at least a vent hole in the grid of the first and the second etch stop structures in the vent hole region, and to hollow out a space beneath the first and the second etch stop structures. A vibration film is coated on the micro-machined metal mesh.

Compared with the conventional techniques, the MEMS device according to the present invention has a lateral vent hole, and, furthermore, since the vent hole structure is disposed on the same side of the substrate on which the MEMS structure is disposed, in the manufacturing process, the release process for the vent hole and the release process for the micro-machined metal mesh of the MEMS structure can be performed simultaneously on the same side of the substrate. Moreover, since the material to be etched away is dielectric, such as, silicon oxide, the time needed for etching is short with respect to silicon etching. Accordingly, the manufacturing process is convenient, and it is easily integrated with the manufacturing process of the logic structure, such as MOS device.

These and other objectives of the present invention will no doubt become obvious to those of ordinary skill in the art after reading the following detailed description of the preferred embodiment that is illustrated in the various figures and drawings.

DETAILED DESCRIPTION

The following embodiments are described for illustrating the present invention.

Figure 1:
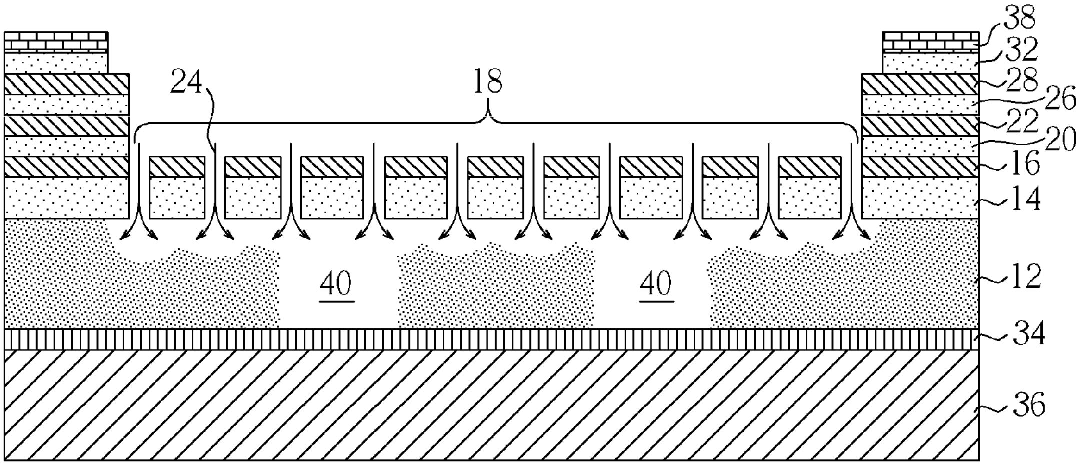
FIG. 1 PRIOR ART
FIGS. 1 and 2 are schematic cross-section views illustrating two examples of making a micro-machined metal mesh of MEMS devices in the prior art.
Figure 2:
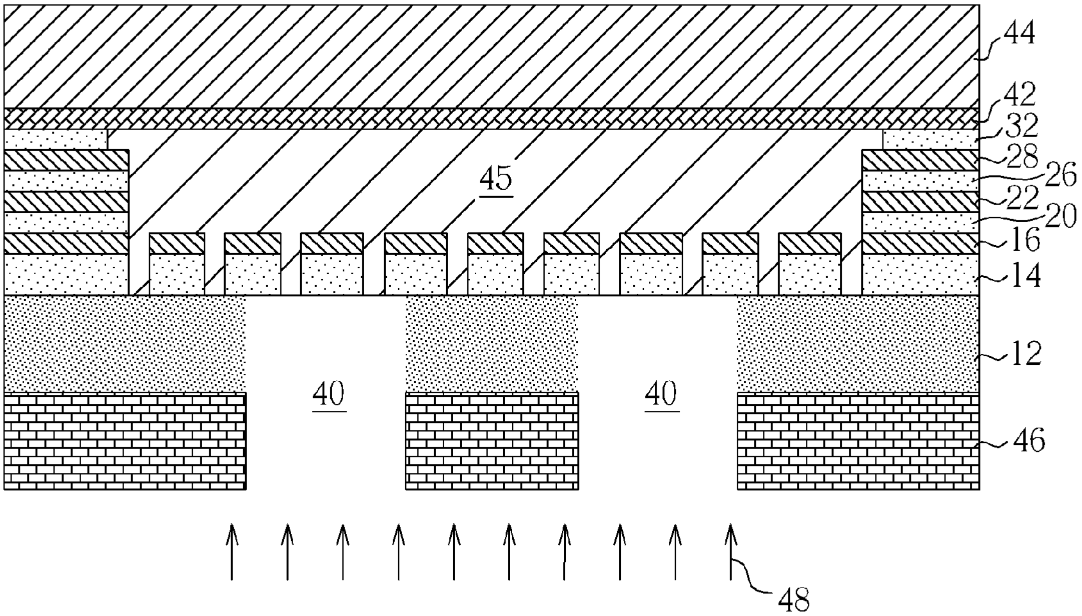
FIG. 2 PRIOR ART
Figure 3:
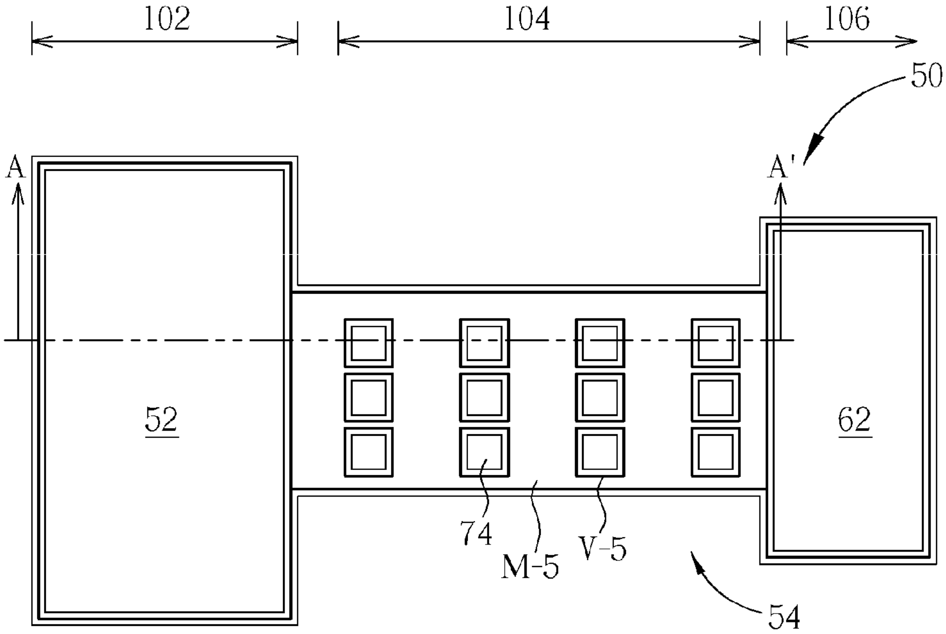
FIG. 3 is a schematic plan view illustrating an embodiment of the MEMS device according to the present invention.
Figure 4:
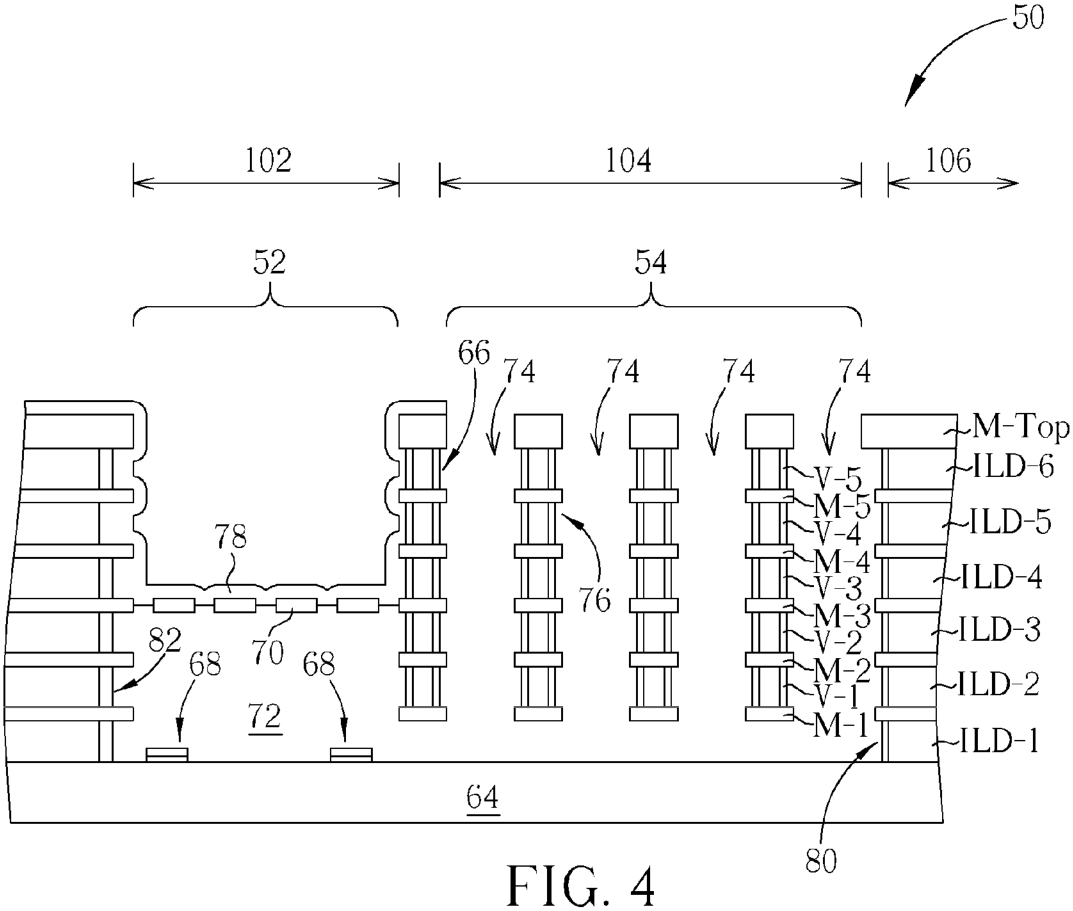
FIG. 4 is a schematic cross-section view along the line AA' shown in FIG. 3.

FIGS. 3 and 4 show an embodiment of the MEMS according to the present invention. FIG. 3 is a schematic plan view thereof. As shown in FIG. 3, the MEMS device 50 may include a MEMS region 102 and a vent hole region 104, and may further include a logic region 106. A MEMS structure 52, such as, a microphone, a microspeaker, or the like, is disposed in the MEMS region 102. A vent hole structure 54 is disposed on the vent hole region 104. The vent hole structure 54 includes, for example, vent holes 74 formed through a stack of a plurality of patterned metal layers (such as the fifth metal layer M-5 shown) and a plurality of trench-shaped vias (such as the fifth trench-shaped via V-5 shown). A logic structure 62, such as a MOS device or a metal interconnect, is disposed in the logic region 106. The MEMS structure 52 and the logic structure 62 may be further surrounded by an etch stop structure respectively for protection during the release process. The etch stop structure, or may referred to as "protection ring", is a wall-shaped protection structure made up by a plurality of metal layers and trench-shaped vias alternately stacked up and down. The etch stop structure may be disposed so as to surround the MEMS region to protect structures not in the MEMS region during the release process. Such etch stop structure is explicitly described in the specification of co-pending U.S. patent application Ser. No. 12/056,286 invented by some same inventors and assigned to the same assignee, which is entirely incorporated by reference.

FIG. 4 is a schematic cross-section view along the line AA' shown in FIG. 3. As shown in FIG. 4, the MEMS device 50 of the present invention includes a substrate 64, a MEMS structure 52 disposed on the substrate 64 in the MEMS region 102, and a vent hole structure 54 disposed on the substrate 64 in the vent hole region 104. The vent hole structure 54 is disposed on the same side of the substrate 64 on which the MEMS structure 52 is disposed. The vent hole structure 54 adjoins the MEMS structure 52 with an etch stop structure 66 therebetween. The MEMS structure 52 includes at least an electrode structure 68 and a micro-machined metal mesh 70. The electrode structures 68 are disposed on the substrate 64. In other embodiments, the electrode structure may be disposed within the substrate. The micro-machined metal mesh 70 is disposed over the substrate 64, so as to have a distance from the substrate 64. An empty chamber 72 is formed between the micro-machined metal mesh 70 and the substrate 64. The micro-machined metal mesh 70 may be coated with a vibration film 78. The vent hole structure 54 includes at least a vent hole 74 surrounded by the etch stop structure 66 or an etch stop structure 76. The bottom of the etch stop structure 66 and the bottom of the etch stop structure 76 have a distance from the substrate 64, such that the vent holes 74 communicate with the chamber 72. That is, the air in the chamber 72 can be compressed and then laterally flows to vent holes 74 to exhaust when the vibration film 78 vibrates.

It should be noticed that the etch stop structures 66 and 76 shown in FIG. 4 each include a plurality of metal layers (such as the first metal layer M-1, the second metal layer M-2, the third metal layer M-3, the fourth metal layer M-4, the fifth metal layer M-5, and the top metal layer M-Top) and a plurality of trench-shaped vias (such as the first, second, third, fourth, and fifth trench-shaped vias V-1, V-2, V-3, V-4, and V-5) alternately stacked together. The bottoms of the etch stop structures 66 and 76 are not higher than both the micro-machined metal mesh 70 and the vent holes 74. Furthermore, the bottom of the etch stop structure 66 does not connect the substrate 64. For example, as shown in FIG. 4, the etch stop structures 66 and 76 are not formed from the contact via to connect the substrate but from the first metal layer M-1. In such way, the chamber 72 and the vent hole 74 are allowed to communicate with each other through the etch stop structures 66 and 76 after the release process performed on the interlayer dielectrics.

Furthermore, another etch stop structure, such as the etch stop structure 82 or 80, can be formed to surround the entire MEMS structure 52 and the vent hole structure 54, serving as a protection ring, to prevent the structures other than the MEMS structure 52 and the vent hole structure 54 from damage during the release process. The etch stop structures 80 and 82 are formed by starting forming one or more trench-shaped contact vias in the firs interlayer dielectrics ILD-1 and then alternately stacking the metal layers and the trench-shaped vias upwardly.

Figure 5:
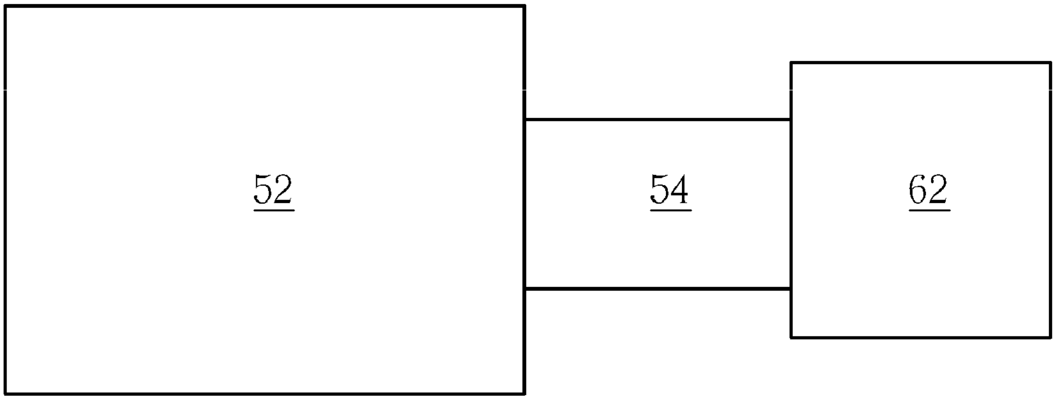
FIGS. 5 and 6 are schematic graphs illustrating two examples of the arrangement of the MEMS structure, the vent hole structure, and the logic structure according to the present invention.
Figure 6:
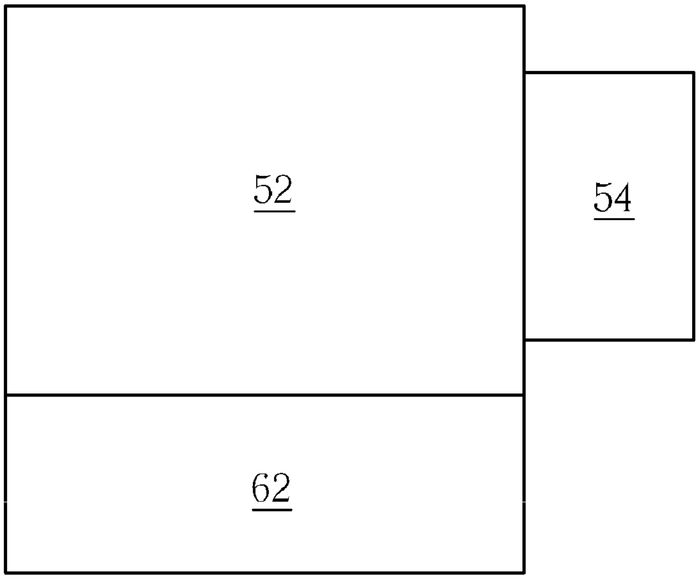

The MEMS device 50 may further include a logic structure disposed on the substrate 64 in the logic region 106. The logic structure is on the same side of the substrate 64 on which the MEMS structure 52 is disposed. One of the vent hole structure 54 and the MEMS structure 52 adjoins the logic structure with the etch stop structure 80 therebetween. FIGS. 5 and 6 show two examples of the arrangement. The vent hole structure 54 may be disposed on only one or more sides of the MEMS structure 52 or to entirely surround the MEMS structure 52. The logic structure 62 may adjoin the vent hole structure 54 only and not the MEMS structure 52, or the logic structure 62 may adjoin the MEMS structure 52. The logic structure may include a metal interconnect structure including a plurality of metal layers, vias, and interlayer dielectrics.

As described above, the etch stop structure 66 is disposed such that its bottom is not higher than both of the micro-machined metal mesh 70 and the vent holes 74 and it does not contact the substrate 64. Specifically, if the micro-machined metal mesh 70 is formed from the third metal layer M-3, the manufacturing of the etch stop structure 66 may be started with the first metal layer M-1, the second metal layer M-2, or the third metal layer M-3. Accordingly, the vent holes 74 may be disposed at the third metal layer M-3, the fourth metal layer M-4, the fifth metal layer M-5, or the top metal layer M-Top.

Figure 7:
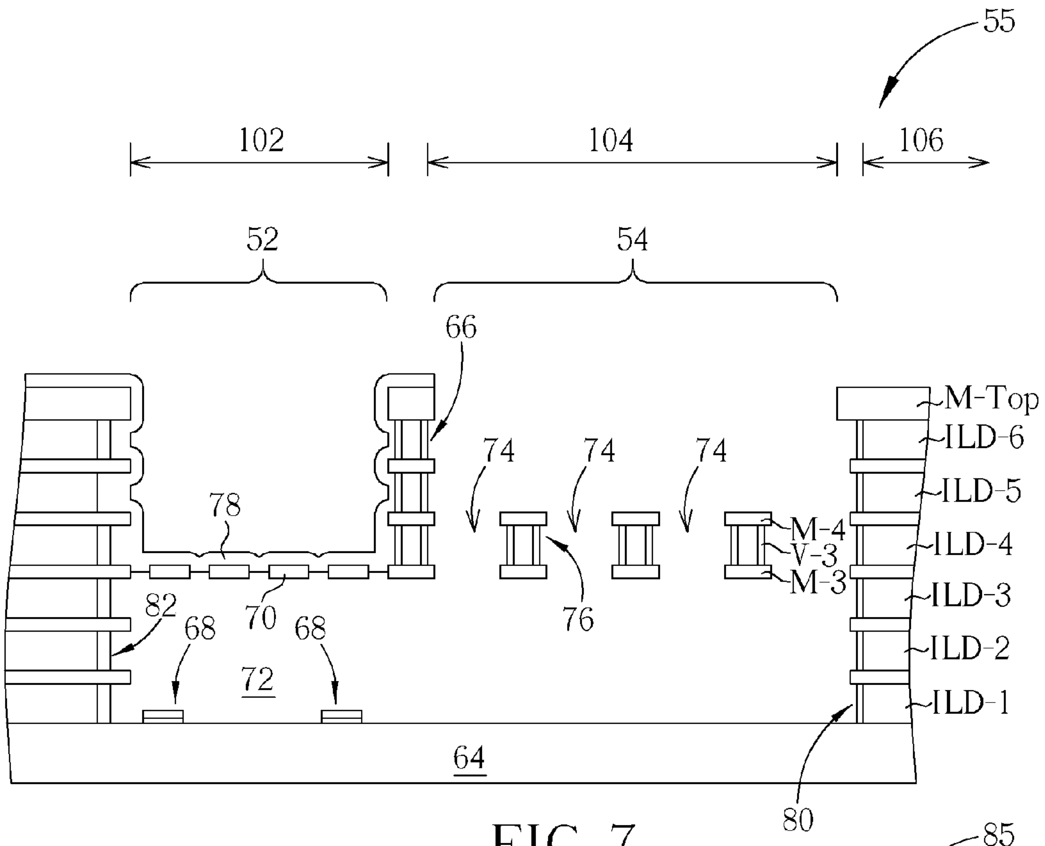
FIG. 7 is a schematic cross-section view illustrating another embodiment of the MEMS device according to the present invention.

The vent holes 74 are located in a metal layer not lower than the micro-machined metal mesh 70 and not lower than the bottom of the etch stop structure 66. Thus, the vent holes may be formed utilizing the space surrounded by the etch stop structure 66 and the etch stop structure 76, or the etch stop structure 76 and the etch stop structure 80. For example, as shown in FIG. 4, the vent holes 74 are disposed in the top metal layer M-Top and throughout the etch stop structure 76 composed of the top metal layer M-Top, the metal layers M-1 to M-5, and the trench-shaped vias V-1 to V-5 to form the openings. FIG. 7 shows another embodiment. In the MEMS device 55, the vent holes 74 are disposed in the fourth metal layer M-4 and throughout the etch stop structure 76 composed of the third metal layer M-3, the fourth metal layer M-4, and the trench-shaped via V-3 to form the openings.

Figure 8:
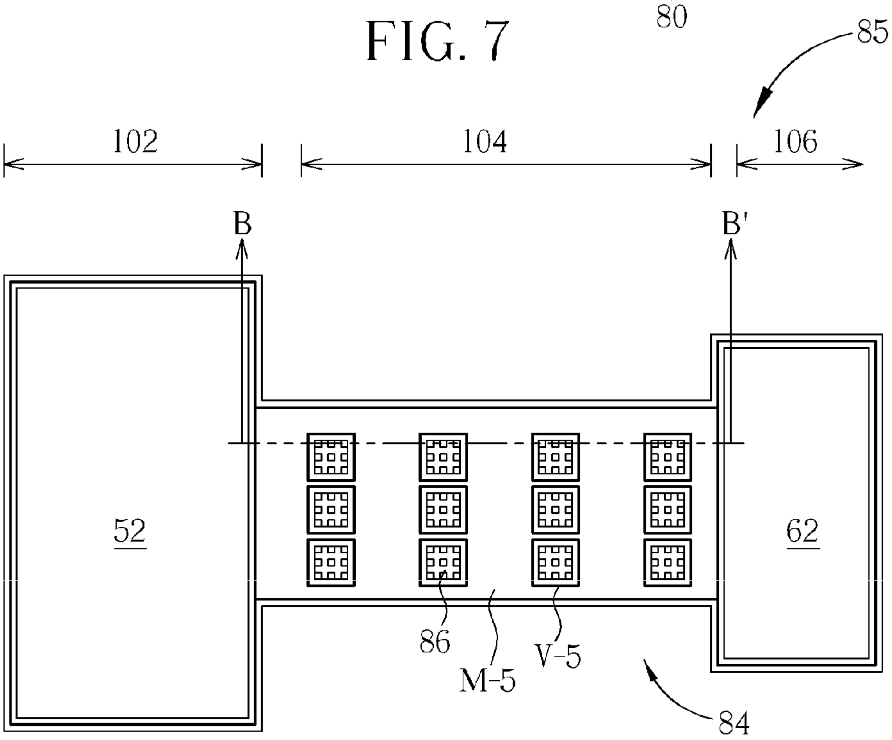
FIG. 8 is a schematic plan view illustrating an embodiment of the MEMS device according to the present invention.
Figure 9:
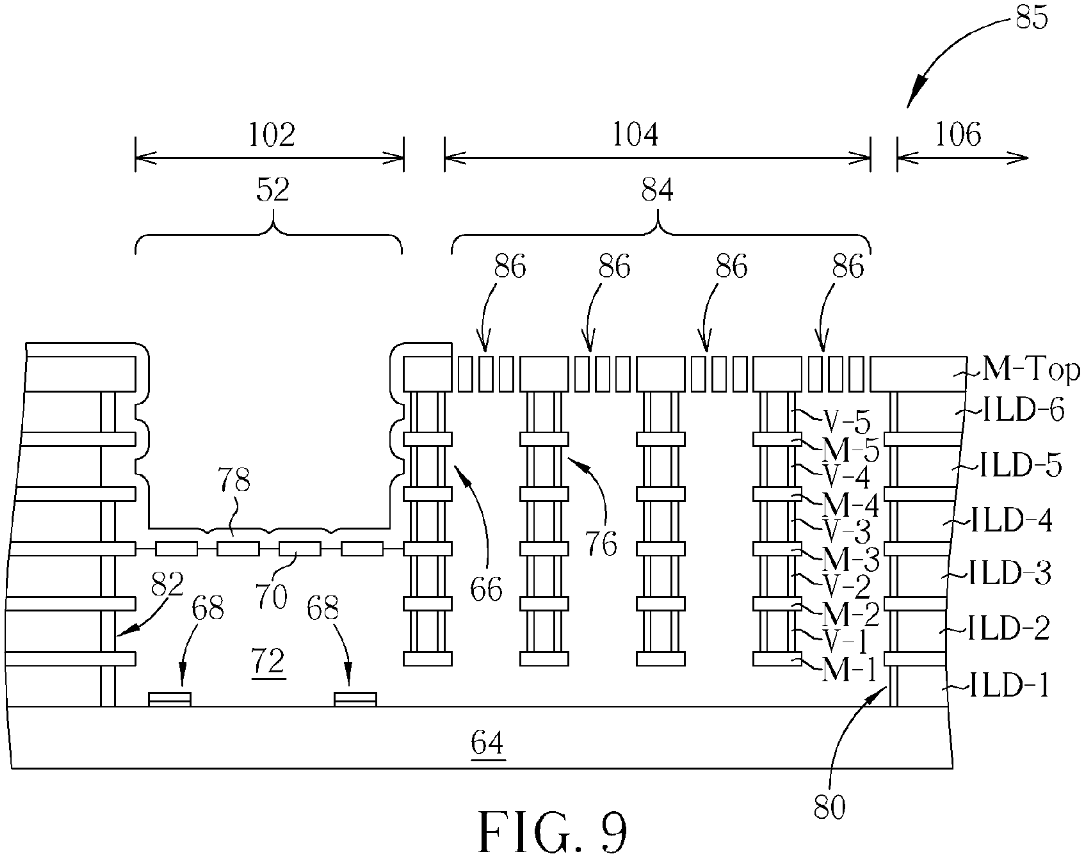
FIG. 9 is a schematic cross-section view along the line BB' shown in FIG. 7.

The vent hole of the vent hole structure may be also a mesh having a plurality of openings. FIG. 8 shows an embodiment. Compared with the vent hole 74, the vent hole 86 of the vent hole structure 84 of the MEMS device 85 further has a mesh-typed hole in a shape of 3×3 grid. FIG. 9 shows a schematic cross-section view of the MEMS device 85 along the line BB' in FIG. 7. The mesh diameter of the vent hole 86 is relatively much small.

Figure 10:
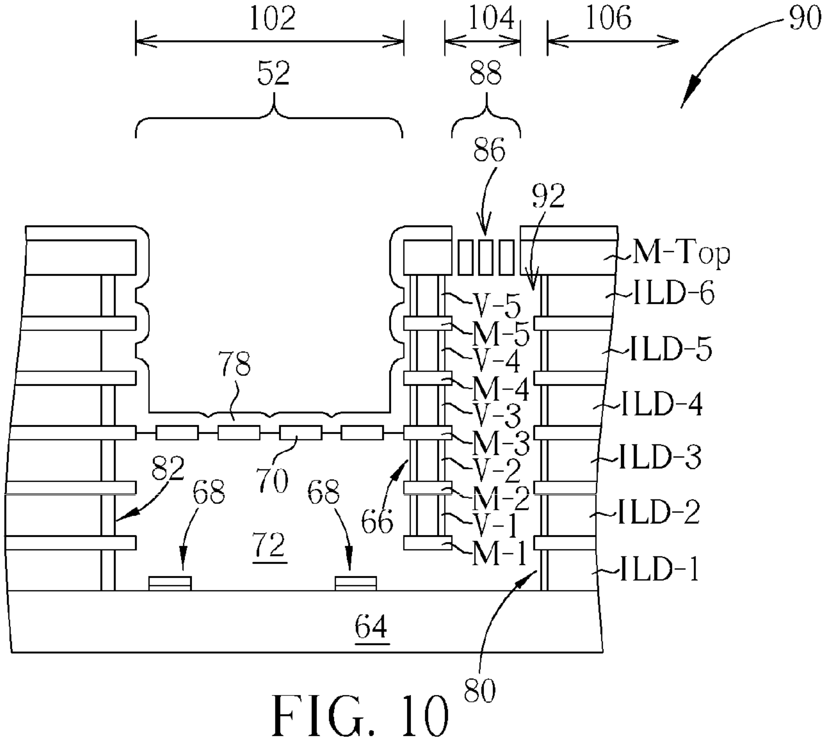
FIG. 10 is a schematic cross-section view illustrating still another embodiment of the MEMS device according to the present invention.

Furthermore, the number of the vent holes of the vent hole structure is not particularly limited. The MEMS device 90 as shown in FIG. 10 includes a vent hole structure 88 having only one mesh-typed vent hole 86, which is formed from a metal layer. The mesh-typed vent hole 86 has some small openings. There is not an etch stop structure further disposed beneath the mesh-typed vent hole 86. The mesh-typed vent hole 86 has a distance from the substrate 64, and thereby an empty chamber 92 is formed between the mesh-typed vent hole 86 and the substrate 64 and communicates with the chamber 72, allowing the chamber 72 to let out air to or get in air from the ambient environment.

Figure 11:
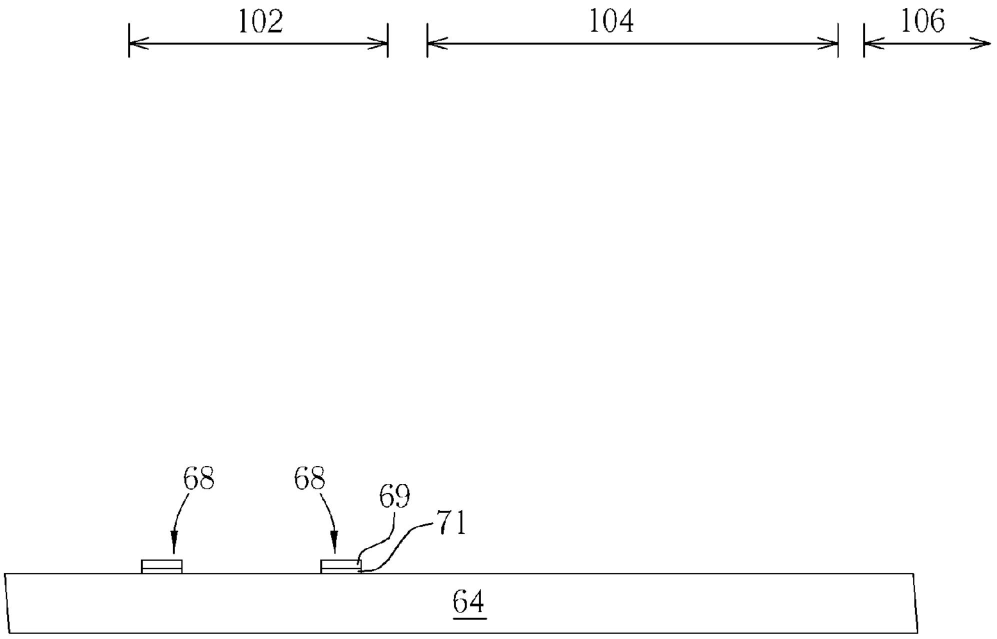
FIGS. 11-14 are schematic cross-section views illustrating an embodiment of the method of making a MEMS device according to the present invention.

The MEMS device according to the present invention can be made by individually forming the MEMS structure, the vent hole structure, and the logic structure, but it is more convenient and economical to forming those structures simultaneously correspondingly from a same metal layer using the metal interconnect process in the semiconductor technology. FIGS. 11-14 illustrate an embodiment of the method of making a MEMS device according to the present invention. As shown in FIG. 11, a substrate 64, such as a semiconductor substrate, such as silicon substrate, is provided. The substrate 64 includes a MEMS region 102 and a vent hole region 104 adjoining the MEMS region 102, and may further include a logic region 106. There are electrode structures 68 composed of a gate 69 and a gate dielectric layer 71 between the gate 69 and the substrate 64 disposed in the MEMS region 102.

Figure 12:
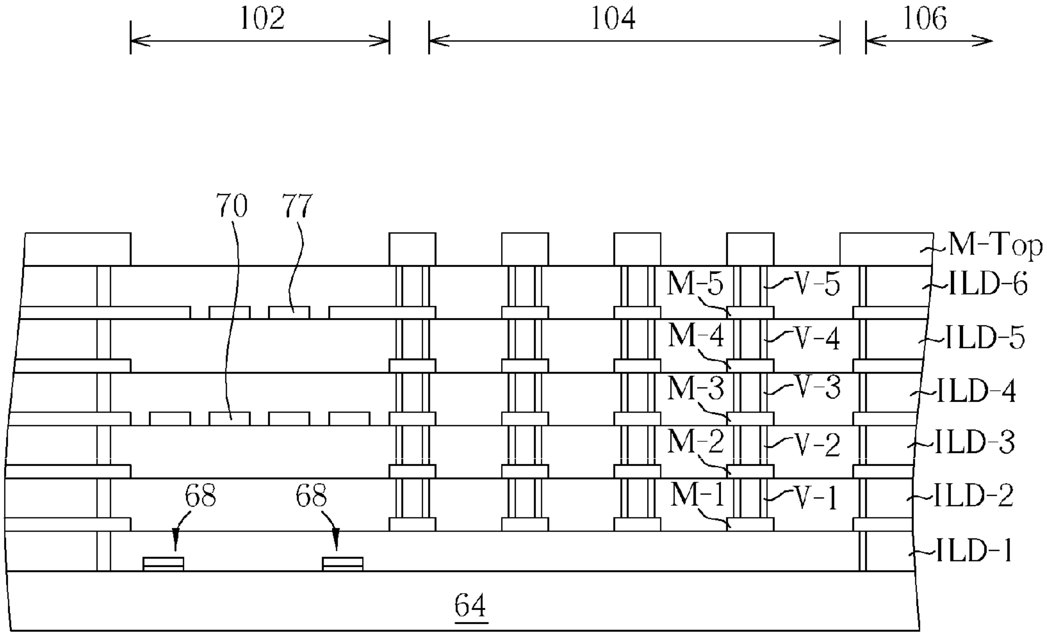

Next, as shown in FIG. 12, a metal interconnect process is performed. Specifically, a first interlayer dielectric ILD-1 is formed on the substrate 64, a patterned first metal layer M-1 is formed on the interlayer dielectric ILD-1 to form a portion of an etch stop structure. A second interlayer dielectric ILD-2 is formed on the first metal layer M-1. A plurality of trenches are formed in the second interlayer dielectric ILD-2 and via material is filled to the trenches to form the first trench-shaped vias V-1 with the bottom contacting the metal layer M-1. The interlayer dielectric may comprise silicon oxide and may be formed by deposition as used in the conventional technology. The metal layer may be formed using a conventional copper process or aluminum process, as well as a damascene or double-damascene process. Likewise, the second metal layer M-2 is formed to stack on the first trench-shaped vias V-1, and then the third interlayer dielectric ILD-3 and the second trench-shaped vias V-2 are formed in the order. Thereafter, the patterned third metal layer M-3 is formed. The third metal layer M-3 further includes a pattern of micro-machined metal mesh in the MEMS region 102. Likewise, the fourth interlayer dielectric ILD-4, the third trench-shaped vias V-3 only located on the third metal layer M-3 of the etch stop structure, the patterned fourth metal layer M-4 stacking on the third trench-shaped vias V-3, the fifth interlayer dielectric ILD-5, and the fourth trench-shaped vias V-4 are formed in the order. Thereafter, the patterned fifth metal layer M-5 is formed and further includes a portion as a metal hard mask 77 located above the micro-machined metal mesh 70 and corresponding to the micro-machined metal mesh 70 for used in the subsequent etching process. Thereafter, the sixth interlayer dielectric ILD-6 is formed and a plurality of the fifth trench-shaped vias V-5 are formed in the six interlayer dielectric ILD-6 with the bottom contacting the fifth metal layer M-5. Thereafter, the patterned top metal layer M-Top is formed on the sixth interlayer dielectric ILD-6 and to contact the fifth trench-shaped vias V-5.

It should be noticed that the bottom of the etch stop structure between the MEMS structure and the vent hole structure has at least a distance from the substrate; however, it is not necessary to form the etch stop structure by starting with the upper surface of the first interlayer dielectric. It is optional to form the etch stop structure by starting with the upper surface of any interlayer dielectric ILD, as long as the bottom of the etch stop structure is not higher than the micro-machined metal mesh and not higher than the vent holes.

The MOS device or the metal interconnect structure in the logic region 106 may be formed simultaneously in the process described above. Accordingly, in the present invention, the thickness and material of the metal layer and the interlayer dielectric may be the same as or similar to the metal layer and the interlayer dielectric of conventional metal interconnect structures. In addition, it should be noticed that in case that the etch stop structure for surrounding the MEMS region and the vent hole structure is formed, trench-shaped contacts should be first formed in the first interlayer dielectric ILD-1 and then the metal layer and trench-shaped vias stack is formed upwardly, to form an entire etch stop structure for protection.

Figure 13:
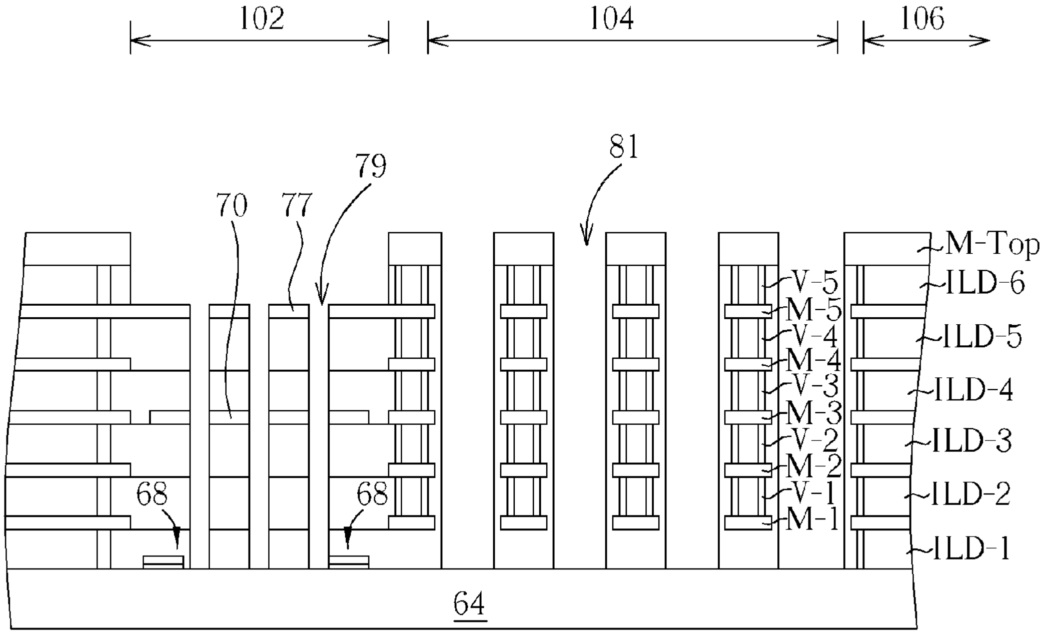
Figure 14:
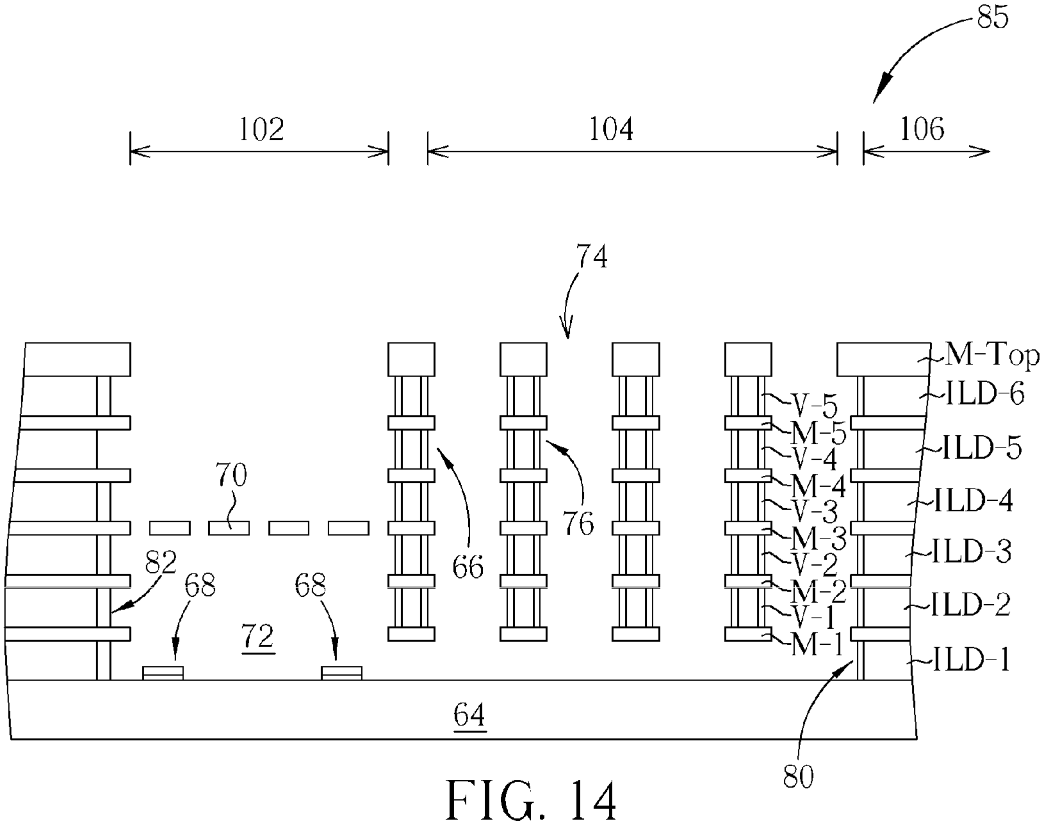

Thereafter, referring to FIG. 13, a release process is performed. First, an anisotropic deep reactive-ion etching (DRIE) process for dry-etching silicon oxide is performed on the MEMS region 102 and the vent hole region 104, respectively using the metal hard mask 77 of the fifth metal layer M-5 and the top metal layer M-Top as a mask to etch through the interlayer dielectrics. The etching stops on the substrate 64 and the openings 79 and 81 are formed. Then, the residual metal hard mask 77 is removed using a metal stripping process. Thereafter, referring to FIG. 14, an isotropic wet etching or vapor etching process is performed to etch away each interlayer dielectric in the MEMS region 102 and the vent hole region 104 using, for example, an etchant containing HF (fluorohydric acid), but the interlayer dielectrics within each of the etch stop structures 66 and 76 are not etched. Thus, a hollowed-out micro-machined metal mesh 70 is formed in the MEMS region 102 and has a distance from the substrate 64 to form a chamber 72, and as well as vent holes 74 are formed in the vent hole region 104 and communicate the chamber 72.

Finally, a vibration film 78 is formed and coated on the micro-machined metal mesh 70, to obtain the MEMS device 50 according to the present invention, as shown in FIG. 4. When the vibration film is silicon, it may be formed right after the patterned metal layer for the micro-machined metal mesh is formed. Thus, since the vibration film is silicon, it is not etched away as the silicon oxide is in the subsequent release process.

Figure 15:
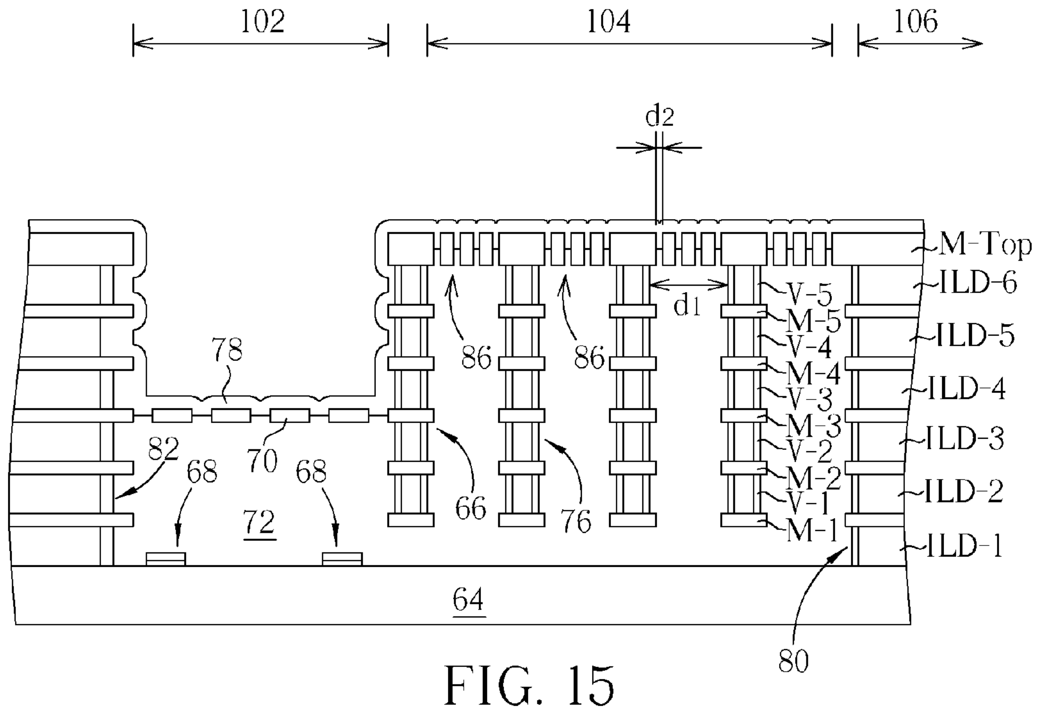
FIGS. 15-16 are schematic cross-section views illustrating another embodiment of the method of making a MEMS device according to the present invention.
Figure 16:
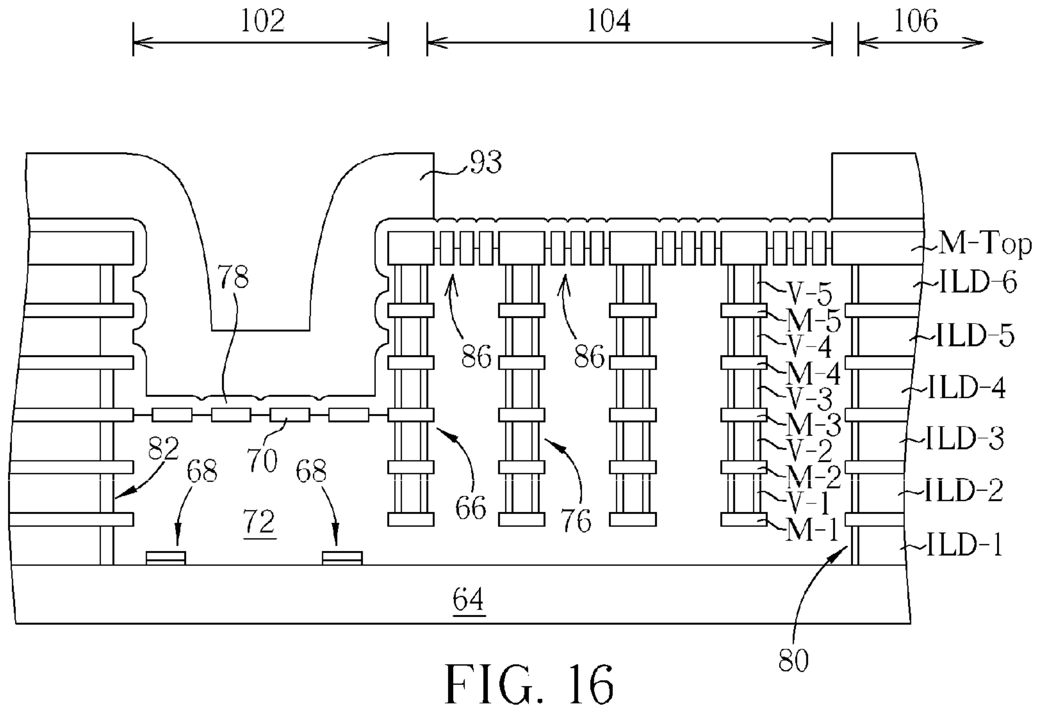

FIGS. 15-16 illustrate another embodiment of the method of making a MEMS device according to the present invention. When the vent hole is the type of the mesh-typed vent hole 86, the vibration film can be conformally formed on the MEMS structure 52 and the vent hole structure 54. The vent hole is mesh-typed to have, for example, an opening width d1 of the vent hole being 6 microns and the mesh diameter $d_2$ being 1.2 microns. Accordingly, melted vibration film material will not fall into the openings of the mesh-typed vent hole. Thereafter, referring to FIG. 16, a patterned photo-resist layer 93 is formed on the surface to expose the vibration film on the mesh-typed vent holes 86. The exposed vibration film is etched away, and then the photo-resist layer 93 is stripped, to form the MEMS device according to the present invention.

All combinations and sub-combinations of the above-described features also belong to the present invention. Those skilled in the art will readily observe that numerous modifications and alterations of the device and method may be made while retaining the teachings of the invention.

What is claimed is:

1. A MEMS device, comprising:

a substrate;

a MEMS structure disposed on the substrate, the MEMS structure comprises:

at least an electrode disposed within or on the substrate, and a micro-machined metal mesh disposed over the substrate such that a first chamber is formed between the micro-machined metal mesh and the substrate; and a vent hole structure disposed on a same side of the substrate on which the MEMS structure is disposed, the vent hole structure adjoining the MEMS structure with a first etch stop structure therebetween, wherein the first etch stop structure comprises a plurality of metal layers and a plurality of trench-shaped vias alternately stacking each other, and the vent hole structure comprises:

a metal layer disposed over the substrate, a second chamber formed between the metal layer and the substrate and communicating with the first chamber through beneath the first etch stop structure, and a plurality of vent holes throughout the metal layer to communicate with the second chamber.

2. The MEMS device of claim 1, wherein the vent holes are arranged as a matrix.

3. The MEMS device of claim 1, wherein the micro-machined metal mesh of the MEMS structure is coated with a vibration film.

4. The MEMS device of claim 1, wherein the bottom of the first etch stop structure is not higher than both of the micro-machined metal mesh and the vent holes and does not connect with the substrate so as to allow the first chamber to communicate with the second chamber.

5. The MEMS device of claim 1, further comprising a second etch stop structure surrounding the MEMS structure and the vent hole structure.

6. The MEMS device of claim 1, further comprising a logic structure disposed on the same side of the substrate on which the MEMS structure is disposed, at least one of the vent hole structure and the MEMS structure adjoining the logic structure with a third etch stop structure therebetween, the logic structure comprising a metal interconnect structure comprising a plurality of metal layers, a plurality of vias, and a plurality of interlayer dielectrics.

7. The MEMS device of claim 6, wherein the micro-machined metal mesh of the MEMS structure and one of the metal layers of the interconnect structure of the logic structure are made from a same metal layer.

8. The MEMS device of claim 7, wherein the micro-machined metal mesh of the MEMS structure and a third metal layer of the interconnect structure of the logic structure are made from a same metal layer.

9. The MEMS device of claim 6, wherein the metal layer of the vent hole structure and one of the metal layers of the interconnect structure of the logic structure are made from a same metal layer.

10. The MEMS device of claim 9, wherein the metal layer of the vent hole structure and a top metal layer of the interconnect structure of the logic structure are made from a same metal layer.

11. The MEMS device of claim 6, wherein the vent hole structure is arranged to be between the MEMS structure and the logic structure.

12. The MEMS device of claim 6, wherein the vent hole structure and the logic structure each adjoin the MEMS structure.

13. A MEMS device, comprising:

a substrate;

a MEMS structure disposed on the substrate, the MEMS structure comprises:

at least an electrode disposed within or on the substrate, and a micro-machined metal mesh disposed over the substrate such that a chamber is formed between the micro-machined metal mesh and the substrate; and a vent hole structure disposed on a same side of the substrate on which the MEMS structure is disposed and adjoining the MEMS structure with a first etch stop structure therebetween, wherein the first etch stop structure comprises a plurality of metal layers and a plurality of trench-shaped vias alternately stacking each other, the vent hole structure comprises at least a vent hole surrounded by the first etch stop structure or a second etch stop structure, and the at least a vent hole communicates with the chamber through beneath the first and the second etch stop structures.

14. The MEMS device of claim 13, wherein the at least a vent hole of the vent hole structure comprises a plurality of vent holes arranged as a matrix.

15. The MEMS device of claim 13, wherein the at least a vent hole of the vent hole structure has a mesh structure.

16. The MEMS device of claim 13, wherein the micro-machined metal mesh of the MEMS structure is coated with a vibration film.

17. The MEMS device of claim 13, wherein the bottom of the first etch stop structure is not higher than both of the micro-machined metal mesh and the at least a vent hole and does not connect with the substrate to allow the chamber to communicate with the at least a vent hole.

18. The MEMS device of claim 13, further comprising a third etch stop structure surrounding the MEMS structure and the vent hole structure.

19. The MEMS device of claim 13, further comprising a logic structure disposed on the same side of the substrate on which the MEMS structure is disposed, wherein at least one of the vent hole structure and the MEMS structure adjoining the logic structure with a third etch stop structure therebetween, and the logic structure comprising a metal interconnect structure comprising a plurality of metal layers, a plurality of vias, and a plurality of interlayer dielectrics.

20. The MEMS device of claim 19, wherein the micro-machined metal mesh of the MEMS structure and one of the metal layers of the interconnect structure of the logic structure are made from a same metal layer.

21. The MEMS device of claim 20, wherein the micro-machined metal mesh of the MEMS structure and a third metal layer of the interconnect structure of the logic structure are made from a same metal layer.

22. The MEMS device of claim 19, wherein, the first etch stop structure comprises a plurality of metal layers and a plurality of trench-shaped vias alternately stacking each other, and the bottom of the first etch stop structure is not higher than both of the micro-machined metal mesh and the at least a vent hole and does not connect with the substrate to allow the chamber to communicate with the at least a vent hole, and at least one of the metal layers or the trench-shaped vias of the first etch stop structure and at least one of the metal layers and the vias of the interconnect structure of the logic structure are formed from a same metal layer.

23. The MEMS device of claim 19, wherein the vent hole structure is arranged to be between the MEMS structure and the logic structure.

24. The MEMS device of claim 19, wherein the vent hole structure and the logic structure each adjoin the MEMS structure.

* * * * *